US 10,825,726 B2

(12) United States Patent
Chen et al.

(10) Patent No.: US 10,825,726 B2
(45) Date of Patent: Nov. 3, 2020

(54) METAL SPACER SELF ALIGNED MULTI-PATTERNING INTEGRATION

(71) Applicant: INTERNATIONAL BUSINESS MACHINES CORPORATION, Armonk, NY (US)

(72) Inventors: Hsueh-Chung Chen, Cohoes, NY (US); James J. Kelly, Schenectady, NY (US); Yann Mignot, Slingerlands, NY (US); Cornelius Brown Peethala, Slingerlands, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 16/161,550

(22) Filed: Oct. 16, 2018

(65) Prior Publication Data
US 2020/0118872 A1    Apr. 16, 2020

(51) Int. Cl.
*H01L 21/768*    (2006.01)
*H01L 21/033*    (2006.01)

(52) U.S. Cl.
CPC .... *H01L 21/76877* (2013.01); *H01L 21/0337* (2013.01); *H01L 21/76802* (2013.01); *H01L 21/76819* (2013.01)

(58) Field of Classification Search
CPC ............. H01L 21/0337; H01L 21/0338; H01L 21/768; H01L 21/76819; H01L 21/76838; H01L 21/76885; H01L 21/76897
See application file for complete search history.

(56) References Cited

U.S. PATENT DOCUMENTS

| | | | |
|---|---|---|---|
| 6,352,917 B1 | 3/2002 | Gupta | |
| 6,689,283 B2 | 2/2004 | Hattori | |
| 9,305,831 B2 | 4/2016 | Ren | |
| 9,735,029 B1 | 8/2017 | Chu | |
| 2014/0084479 A1* | 3/2014 | Yao | H01L 21/02263 257/774 |
| 2014/0273496 A1 | 9/2014 | Kao | |
| 2016/0314985 A1 | 10/2016 | Yang | |
| 2017/0023357 A1 | 1/2017 | Turovets | |

OTHER PUBLICATIONS

Chen et al., "48nm Pitch cu dual-damascene interconnects using self aligned double patterning scheme," Interconnect Technology Conference (IITC), 2013, 3 pp.
Fang et al., "Layout decomposition for spacer-is-metal (SIM) self-aligned double patterning." 20th Asia and South Pacific Design Automation Conference (ASP-DAC), 2015, pp. 671-676.
Kelly et al., "Experimental study of nanoscale Co damascene BEOL interconnect structures," Interconnect Technology Conference/Advanced Metallization Conference (IITC/AMC), 2016, pp. 40-42.
Tagami et al., "56nm-pitch low-k/Cu dual-damascene interconnects integration with sidewall image transfer (SIT) patterning scheme," International Interconnect Technology Conference (IITC), 2012, 3 pp.

* cited by examiner

*Primary Examiner* — Zandra V Smith
*Assistant Examiner* — Molly K Reida
(74) *Attorney, Agent, or Firm* — Cantor Colburn LLP

(57) ABSTRACT

A method and structure of forming an interconnect structure with a sidewall image transfer process such as self-aligned double patterning to reduce capacitance and resistance. In these methods and structures, the spacer is a metal.

7 Claims, 8 Drawing Sheets

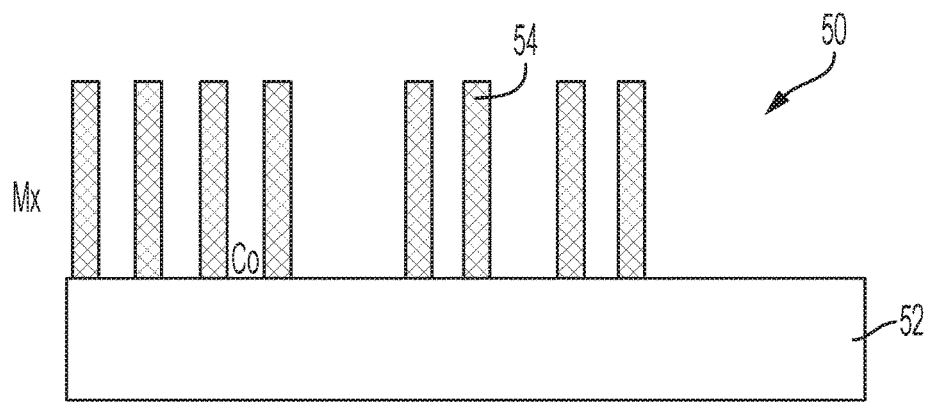
FIG. 9
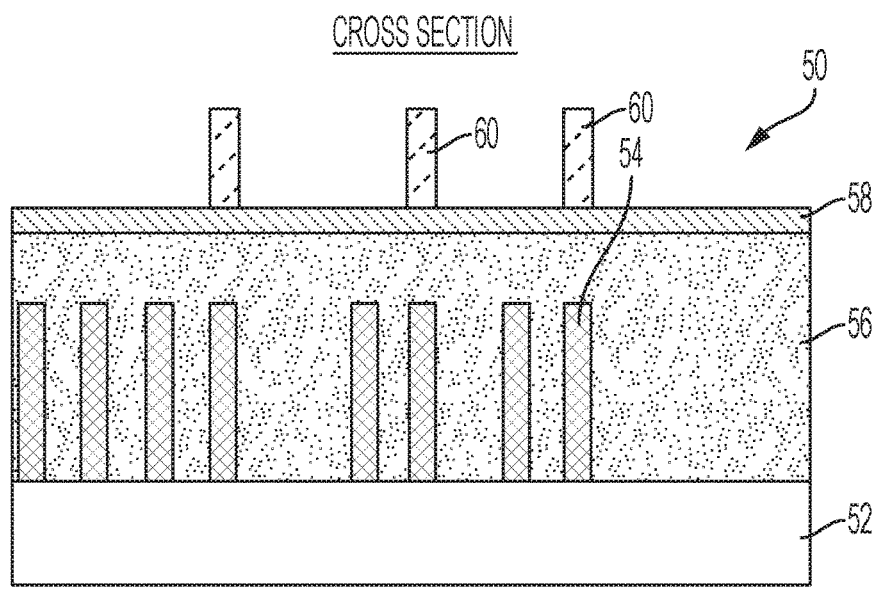
FIG. 10
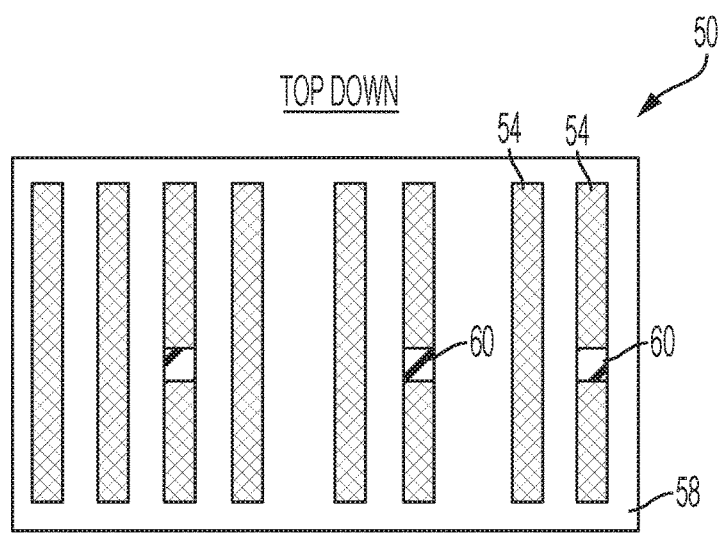

CROSS SECTION

TOP DOWN

METAL SPACER SELF ALIGNED MULTI-PATTERNING INTEGRATION

BACKGROUND

This invention generally relates to integrated circuits and methods of fabrication. More particularly, the present invention relates to back end of the line (BEOL) interconnect structures and methods using a metal spacer in a sidewall image transfer process such as a self-aligned double patterning (SADP) process or a self-aligned quadruple patterning (SAQP) process.

Semiconductor devices are being scaled down in the horizontal dimension to reduce wafer costs by obtaining more chips per wafer or by increasing circuit complexity by obtaining more transistors per chip. Although semiconductor devices are being scaled down in the horizontal dimension, metal interconnects to semiconductor devices are not generally being scaled down in the vertical dimension (because the current density would exceed reliability limits). As follows with horizontal scaling, these tall metal leads are being packed closer and closer together, increasing the aspect ratio (defined as the ratio of conductor height to conductor width) to greater than one and causing capacitive coupling between the leads to become the primary limitation to circuit speed.

Sidewall image transfer processes such as self-aligned double patterning (SADP) or litho-etch-litho etch (LELE) are typically part of the BEOL process for advanced design rules having reduced scaling requirements. The main difference between the two approaches is that in LELE, the layout is divided between two masks, and the second mask is aligned with respect to the first during manufacturing, while SADP generates the pitch (mask) split using spacers that are self-aligned to the first litho-etch step. The second mask in an SADP process is a block or cut mask used to trim the tips of the lines created in the first step and/or remove dummy lines. As a result, the SADP approach produces less variation due to mask misalignment. There are two general SADP approaches: spacer is dielectric (SID) and spacer is mask (SIM).

SUMMARY

Embodiments of the present invention are generally directed to methods of forming interconnect structure. A non-limiting example of a BEOL interconnect structure in accordance with one or more aspects of the present invention includes forming sidewall spacers on a plurality of mandrels that are overlying an intermetal dielectric layer, wherein the sidewall spacers include a metal and define metal lines. The plurality of mandrel are removed. A final metal line pattern is defined in the metal lines. A first dielectric layer is deposited on the final metal line pattern and planarized to the final metal pattern, thereby forming a top planar surface. A second dielectric layer is deposited on the top planar surface and etched to form via openings self-aligned to one or more of the metal lines. The via openings are filled with a metal.

A non-limiting example of a sidewall image transfer method of forming an interconnect structure in accordance with one or more aspects of the present invention includes providing a mandrel pattern overlying a dielectric layer, wherein the mandrel pattern has a height dimension equal to a combined height dimension of a metal line and a via electrically coupled to the metal line feature. A metal is conformally deposited onto the mandrel pattern. The metal is directionally etched back to form metal spacers on sidewalls of the mandrel pattern having the combined height dimension. The mandrel pattern is selectively removed. A trilayer is deposited overlaying the metal spacers including an organic planarization layer, a silicon containing hardmask layer, and a photoresist layer. The photoresist layer is patterned to form one or more pillars. The trilayer is etched to expose a portion of the metal spacers followed by etch back to remove the exposed portion of the metal spacers such that metal vias are formed corresponding to locations of the one or more pillars and metal lines are formed upon removal of the exposed portions. The metal vias are electrically coupled to the metal lines. A final metal line pattern is lithographically patterned from the metal lines. An ultra-low k dielectric layer is deposited, and the ultra-low k dielectric layer is planarized to the metal vias A self-aligned double patterning (SADP) method of forming a back end of line (BEOL) interconnect structure in accordance with one or more aspects of the present invention includes lithographically forming a mandrel pattern overlying a first dielectric layer. A metal layer is conformally deposited onto the mandrel pattern. The metal layer is etch backed to define metal spacers on sidewalls of each mandrel in the mandrel pattern. The mandrel pattern is pulled out, wherein the metal spacers define metal lines at a pitch density greater than that of the mandrel pattern. A trilayer is deposited onto the metal lines, thereby forming a final metal line pattern. A first interlayer dielectric is deposited onto the final metal line pattern and planarized to the metal line pattern so as to form a planar top surface. A second dielectric layer is deposited. One or more vias are formed in the second dielectric layer to selected metal lines in the metal line pattern. The one or more vias are filled with a metal.

A self-aligned double patterning (SADP) method of forming a back end of line (BEOL) interconnect structure in accordance with one or more aspects of the present invention includes lithographically forming a mandrel pattern overlying a first dielectric layer, wherein the mandrel has a height dimension equal to a combined height dimension of a metal line and a via electrically coupled to the metal line. A metal layer is conformally deposited onto the mandrel pattern and etched back to define metal spacers on sidewalls of each mandrel in the mandrel pattern. The mandrel pattern is pulled out, wherein the metal spacers define metal lines at a pitch density greater than that of the mandrel pattern and at the combined height dimension. A first trilayer is deposited onto the metal lines and a final metal line pattern is formed. A second trilayer is deposited including an organic planarizing layer, a silicon containing hardmask and a photoresist onto the final metal line pattern. The photoresist layer is patterned to form a plurality of pillars in alignment with selected metal lines. The trilayer is etched so as to expose a portion of the metal lines that do not underlie the plurality of pillars. The exposed portion of the metal lines is etched back to define a height dimension of the metal lines. The metal line underlying the plurality of pillars further includes a via, wherein the combination of the metal line and the via are at the combined height. A remaining portion of the trilayer is removed. A final metal pattern of the metal lines is defined. An interlayer dielectric layer is deposited. The interlayer dielectric layer is planarized to the via so as to form a planar top surface.

A method of forming an interconnect structure in accordance with one or more aspects of the present invention includes conformally depositing cobalt onto a plurality of mandrels that are overlying an intermetal dielectric layer. The cobalt is etched back from horizontal surfaces to form"

cobalt spacers on sidewalls of the plurality of mandrels. The plurality of mandrels are removed to define a plurality of metal lines from the cobalt spacers. A final metal line pattern is defined in the metal lines by a cut lithography and patterning process. An intermetal dielectric is deposited onto the final metal line pattern. The intermetal dielectric is planarized stopping at the final metal line pattern. An inter-via dielectric is deposited on the intermetal dielectric. The inter-via dielectric is etched to form via openings self-aligned to one or more of the metal lines. The via openings are filled with a metal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure ("FIG.") 1 is a cross-sectional view depicting a semiconductor structure at an intermediate stage of manufacturing for advanced design rules including a mandrel pattern in accordance with an embodiment of the present invention;

FIG. 9 depicts a semiconductor structure at an intermediate stage of manufacturing for advanced design rules including metal lines having a height equal to a combined height of a desired metal line and a via in accordance with an embodiment of the present invention;

FIG. 10 depicts a top down view and a cross sectional view of the semiconductor structure of FIG. 9 subsequent to via pillar formation in a photoresist layer of a trilayer structure in accordance with an embodiment of the present invention;

Figure 1:
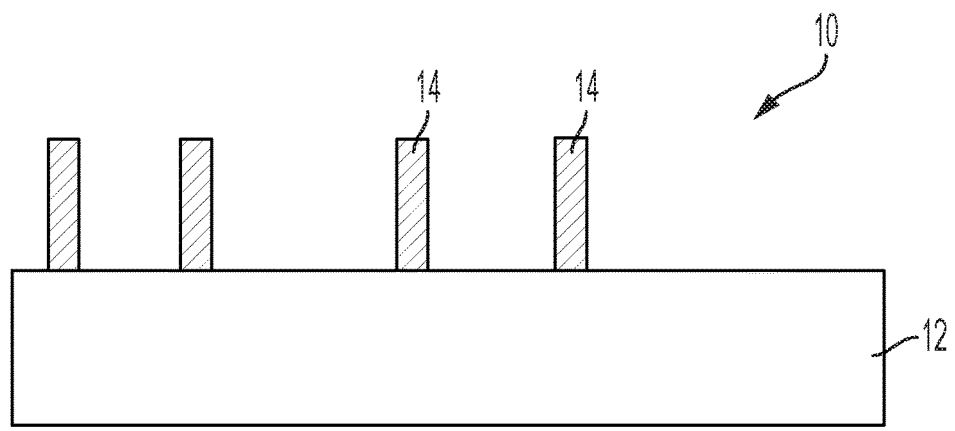

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

Integrated circuits typically have multiple interconnect levels, each level consisting of metallic lines and vias formed within an interlayer dielectric (i.e., intermetal dielectric) that are often formed using damascene processes (via plus next level conductor). The metallic lines and vias can be of the same or different conductive material. The conductive materials can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. Alloys based on copper with an additive metal (such as Ti or Sn) can also be used.

As dimensions such as metal line pitch within an interconnect level continue to shrink along with front end of line (FEOL) pitch, the spaces between metal lines also become limited. For the 7 nm technology node, patterning requirements include a metal pitch of 40 nm or less. This narrow pitch requirement forces the use of spacer based pitch multiplication techniques.

In spacer patterning, a spacer is a film layer formed on the sidewall of a pre-patterned feature, which is referred to as a mandrel. A spacer is formed by deposition or reaction of the film on the previous pattern, followed by etching to remove all the film material on the horizontal surfaces, leaving only the material on the sidewalls. By removing the original patterned feature, only the spacer is left. However, because there are two spacers for every line, the line density has now doubled. This is commonly referred to as Self-Aligned Double Patterning (SADP). When SADP is repeated, an additional halving of the pitch is achieved. This is often referred to as Self-Aligned Quadruple Patterning (SAQP).

As understood by one skilled in the art, there are two masking steps: the first mask is called the mandrel mask and the second mask is called the block mask. These masks are quite different from the masks normally utilized in single-patterning or litho-etch-litho-etch (LELE) double patterning processes. Because spacer material is deposited on each side of the mandrel pattern, two shapes are created for every one shape originally defined, essentially pitch splitting the original lines (e.g., two mandrel mask shapes produce four spacers at half the pitch). As such, the spacer technique is applicable for defining narrow gates at half the original lithographic pitch, for example.

As pitch splitting has become more difficult due to possible differences in feature positions between different exposed parts, sidewall image transfer (SIT) has become more recognized as the necessary approach. The SIT approach typically requires a spacer layer to be formed on an etched feature's sidewall. If this spacer corresponds to a conducting feature, then ultimately it must be cut at no less than two locations to separate the feature into two or more conducting lines as typically expected. On the other hand, if the spacer corresponds to a dielectric feature, cutting would not be necessary.

As spacer materials are commonly hardmask materials, their post-etch pattern quality tends to be superior compared to photoresist profiles after etch, which are generally plagued by line edge roughness.

The main issues with the spacer approach are whether the spacers can stay in place after the material to which they are attached is removed, whether the spacer profile is acceptable, and whether the underlying material is attacked by the etch removing the mandrel material attached to the spacer. Pattern transfer is complicated by the situation where removal of the material adjacent to the spacers also removes a little of the underlying material. This results in higher topography on one side of the spacer than the other. Any misalignment of masks or excursion in pre-patterned feature critical dimension (CD) will cause the pitch between features to alternate, a phenomenon known as pitch walking.

The positioning of the spacer also depends on the pattern to which the spacer is attached. If the pattern is too wide or too narrow, the spacer position is affected. However, this would not be a concern for critical memory feature fabrication processes which are self-aligned.

In embodiments of the present invention, the spacer is metal, which mitigates pitch walking and simplifies process flow. Relative to conventional SADP processes where spacer is a dielectric, complicated pattern transfer in the hard mask is eliminated as well as dielectric directional etching and planarization. Instead, and as will be described herein, when the spacer is metal the vias can be formed by etch back.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Moreover, numerous specific details are set forth in the following description, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention. Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, VLSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that embodiments of the present invention will be described in terms of a given illustrative architecture; however, other architectures, structures, substrate materials and process features and steps can be varied within the scope of the present invention.

It should also be noted that certain features may or may not be shown in all figures for the sake of clarity. This is not intended to be interpreted as a limitation of any particular embodiment, or illustration, or scope of the claims.

SADP (or SAQP) generates the pitch (mask) split using spacers that are self-aligned to the first litho-etch step. The second mask in an SADP process is a block or cut mask used to trim the tips of the lines created in the first step and/or remove dummy lines. As a result, the SADP approach produces less variation due to mask misalignment.

Referring now to the drawings in which like numerals represent the same or similar elements and initially to FIG. 1, a cross sectional view of a semiconductor structure 10 at an intermediate stage of manufacturing an interconnect level for advanced design rules is generally shown, in accordance with an embodiment of the present invention. The semiconductor structure 10 includes an interlayer dielectric layer (ILD) 12 (also referred to as the intermetal dielectric) having a planarized upper surface, an optional hardmask layer (not shown) on the planar upper surface, and an amorphous silicon (aSi) mandrel pattern 14 overlying the ILD 12, all of which typically overlay a variety of front end of line devices formed on a substrate (not shown). The ILD 12 can be part of the lower metallization level, e.g., (Mx). As will be described in greater detail, the interconnect level formed during a BEOL process includes metal lines at a relatively tight pitch formed in an ultralow k dielectric layer 12. The depicted interconnect level is not intended to be limited and is generally shown to illustrate the versatility in forming metal lines at a tight pitch with airgaps therebetween to further reduce capacitance and to illustrate structural stability when defining line ends within a metal line, which can be problematic when using ultralow k dielectrics and relatively small feature sizes.

The ILD 12 can include any dielectric material including inorganic dielectrics or organic dielectrics. The dielectric material can be porous or non-porous. Some examples of suitable dielectric materials include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD 12 can be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate (not shown). The thickness of the ILD generally ranges from 50 nm to 70 nm, although lesser and greater thicknesses can also be employed.

The optional hardmask layer can be metal oxide or nitride deposited at lower temperature (e.g., less than 400° C.), such as a Ti-based or Al-based or Ta-based metal oxide or nitride/oxynitride, and the like. In one or more embodiments, multiple layers can be used to define the optional hardmask layer.

Figure 2:
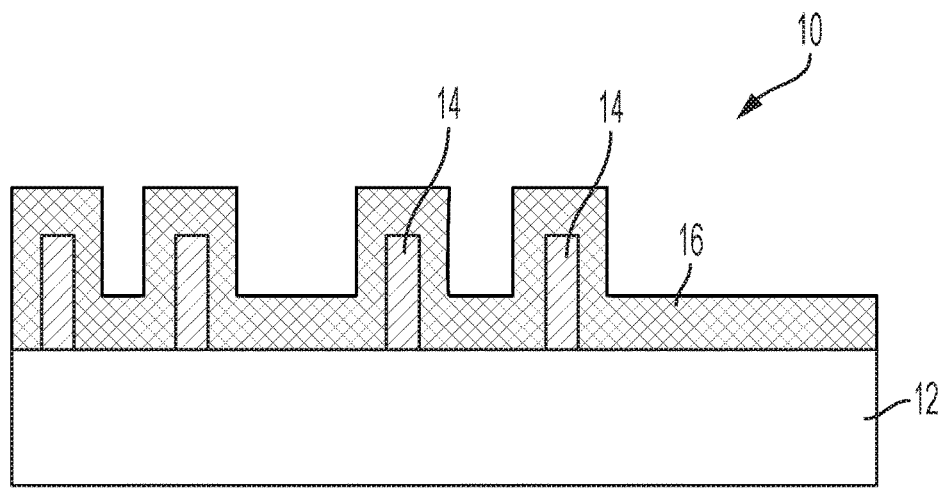
FIG. 2 depicts a cross sectional view of the semiconductor structure of FIG. 1 subsequent to spacer is metal conformal deposition on the mandrel pattern in accordance with an embodiment of the present invention.

FIG. 2 depicts a cross sectional view of the semiconductor structure 10 of FIG. 1 subsequent to conformal deposition of a metal layer 16. The metal layer 16 can be deposited by plasma vapor deposition, atomic layer deposition, or chemical vapor. As will be described in greater detail below, the metal layer will define the spacer such that the spacer is metal (SIM). Moreover, because a conformal layer of metal is deposited onto the mandrel pattern, consistent metal critical dimensions can be obtained. Exemplary metals include, without limitation, cobalt, ruthenium, tantalum, tungsten, aluminum, rhodium, platinum, nickel, silver gold, or combinations thereof. In one or more embodiments, the metal is cobalt.

Figure 3:
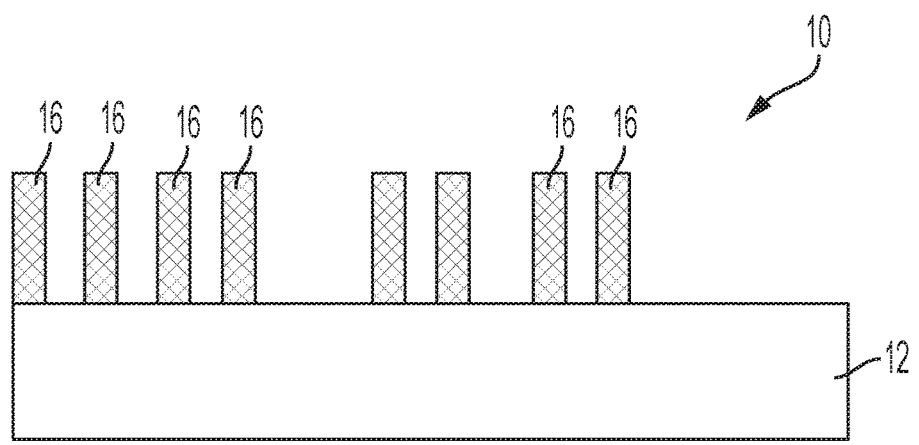
FIG. 3 depicts a cross sectional view of the semiconductor structure of FIG. 2 subsequent to metal spacer etch back and mandrel pullout in accordance with an embodiment of the present invention.

FIG. 3 depicts a cross sectional view of the semiconductor structure 10 of FIG. 2 subsequent to spacer etch back, i.e., the metal spacer is subsequently etched back so that the spacer portion covering the mandrel is etched away while the spacer portion on the sidewall remains. Following spacer etch back, the mandrel is pulled out. Spacer etch back can include subjecting the structure 10 to a directional etch process such as reactive ion etch. The directional etch process is selective to the mandrel 14, which removes the cobalt metal layer from the horizontal surfaces and exposes the ILD 12, and the top surface of the mandrel 14, wherein the metal spacer on sidewalls of the mandrel remain. The mandrel 14 is then pulled out using an etching process using a wet etch process or a dry etch process. For example, a wet etch process can include exposing the substrate to hot phosphoric acid selective the ILD 12.

Figure 4:
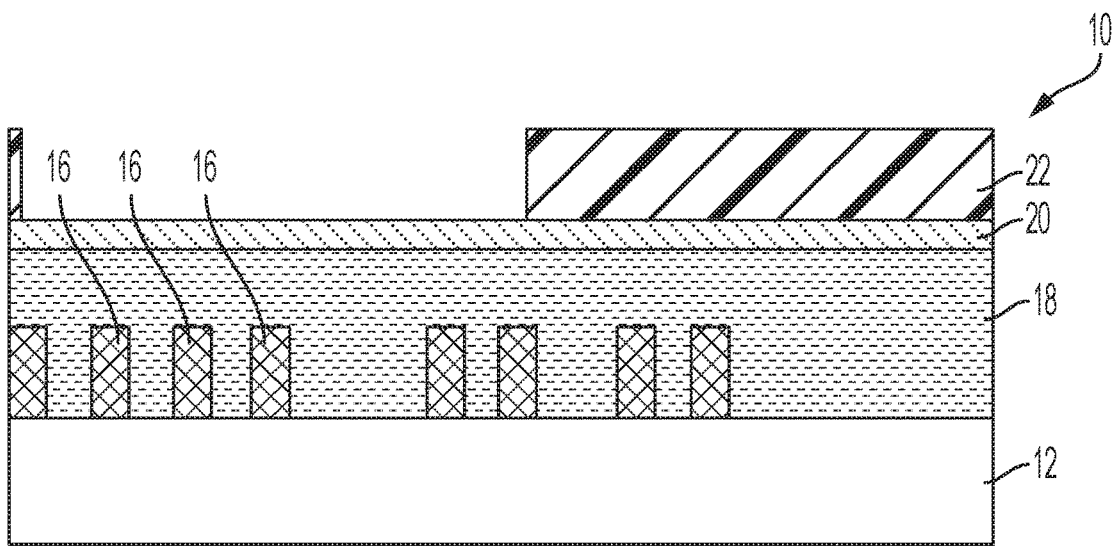
FIG. 4 depicts a cross sectional view of the semiconductor structure of FIG. 3 subsequent to cut lithography and patterning to define a final metal line pattern on a prior metallization level in accordance with an embodiment of the present invention.

FIG. 4 depicts a cross sectional view of the semiconductor structure 10 of FIG. 3 subsequent to cut lithography and patterning to define the final metal pattern. Photolithography can include depositing a trilayer including an organic planarizing layer (OPL) 18, a silicon containing hardmask 20, and a photoresist 22 onto the structure 10 and forming openings where desired by exposing the photoresist to a pattern of activating radiation, and then developing the exposed photoresist with a resist developer to provide a patterned photoresist. At least one highly selective etch process can then be employed to transfer the pattern from the patterned photoresist into the hardmask. The reduction in photoresist thickness as the devices scale to smaller dimensions make the photoresist no longer of capable of acting as a mask for transfer into the substrate. Consequently, the etch selectivity can be similar to that of the silicon containing hardmask layer, which generally results in significant photoresist loss and profile degradation. The pattern in the silicon containing hardmask layer 20 is transferred into the organic underlayer 18 utilizing a wet etch process or an oxygen reactive ion etch process. After transferring the pattern, the trilayer is removed utilizing resist stripping processes, for example, ashing.

The photoresist layer 22 can include a carbon backbone polymer and include other suitable components such as a solvent and/or photoacid generators. For example, the photoresist can be a chemical amplified resist known in the art. In one or more embodiments, the photoresist layer includes a photoacid generator distributed in the photoresist layer. When absorbing radiation energy from an exposure process, the photo-acid generator forms a small amount of acid. The resist can include a polymer material that varies its solubility to a developer when the polymer is reacted with this generated acid.

The silicon-containing hardmask 20 overlaying the organic planarizing layer 18 can be silicon, silicon nitride, silicon carbide, silicon oxide, nitrided silicon carbide, silicon oxynitride, or the like. The silicon-containing hardmask 20 protects the organic underlayer 18 during RIE processing and has an etch selectivity different than underlayer. In one or more embodiments, the silicon containing hardmask is a silicon containing bottom anti-reflective coating ("SiBARC"). Incorporating silicon into the bottom anti-reflective coating results in an anti-reflective coating that provides reflection control but also can function as an etch transfer mask, i.e., a hard mask.

The OPL 18 can be a polymer including carbon, hydrogen, oxygen, and optionally nitrogen, fluorine, and silicon. In one or more embodiments, the planarization layer 30 is a polymer with sufficiently low viscosity so that the top surface of the applied polymer forms a planar top surface. In one or more other embodiments, the organic planarizing layer is a layer of material capable of being planarized by known chemical mechanical planarization processes. The organic planarization layer, which can be a spin-deposited layer, can be baked at an elevated temperature to cure the planarization layer, if needed, and reflow its top surface into a substantially planar form. The thickness of the planarization layer can be about 50 nanometers to about 300 nanometers (nm), although lesser and greater thicknesses can also be employed. Exemplary OPL materials include, without limitation, crosslinked polyhydroxystyrene, crosslinked polyacrylate(methycrylate) including cyclic alkyl groups, crosslinked polyacrylate(methacrylate) including fluorinated alkyl groups or aryl groups or both.

Figure 5:
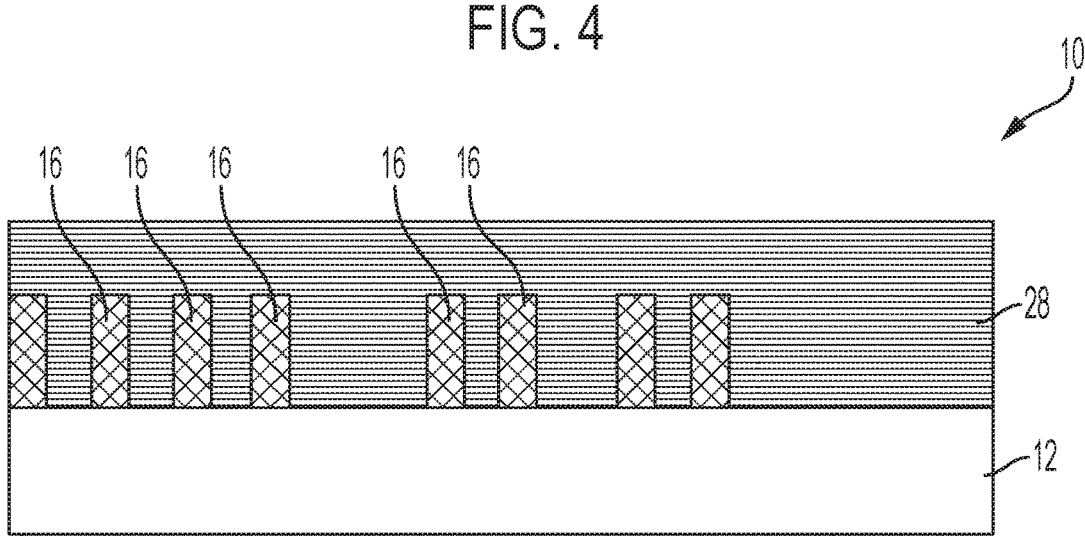
FIG. 5 depicts a top down view and cross sectional view of the semiconductor structure of FIG. 4 subsequent to interlayer (intermetal) dielectric deposition in accordance with an embodiment of the present invention.

FIG. 5 depicts a cross sectional view of the semiconductor structure 10 of FIG. 4 subsequent to deposition of an ultra-low k dielectric layer 28. In one or more embodiments, the ultralow k dielectric layer 28 generally includes dielectric materials having a k value less than 3.0. In one or more other embodiments, the ultralow k dielectric layer 28 generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraethoxysilane (TEOS).

Figure 6:
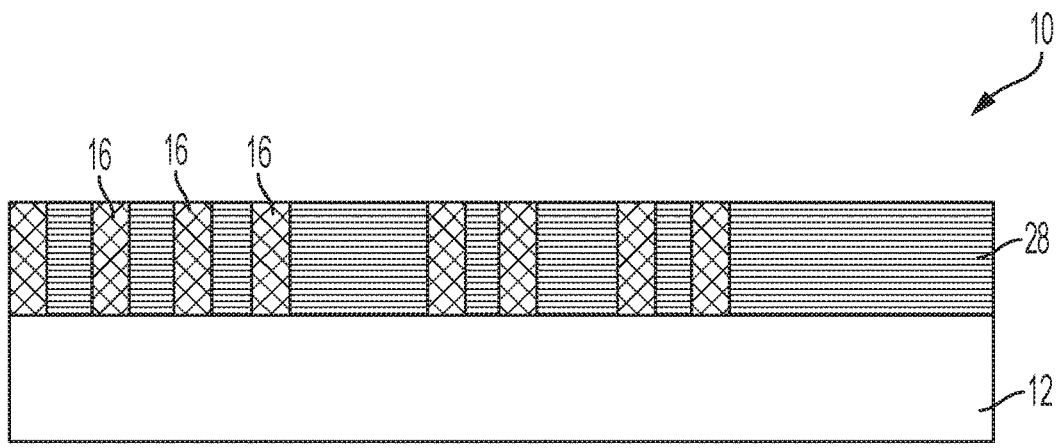
FIG. 6 depicts a top down view and cross sectional view of the semiconductor structure of FIG. 5 subsequent to planarization of the dielectric layer to the metal lines in accordance with an embodiment of the present invention.

FIG. 6 depicts a cross sectional view of the semiconductor structure 10 of FIG. 6 subsequent to planarization of the dielectric layer 28 so as to provide a top planar surface. Planarization can include chemical-mechanical-polishing (CMP) to form the planar surface. The CMP process utilizes a non-selective slurry composition that typically contains a silica abrasive material. Alternatively, an etch back process can be used to planarize the dielectric surface 28 selective to the metal spacer 16.

Figure 7:
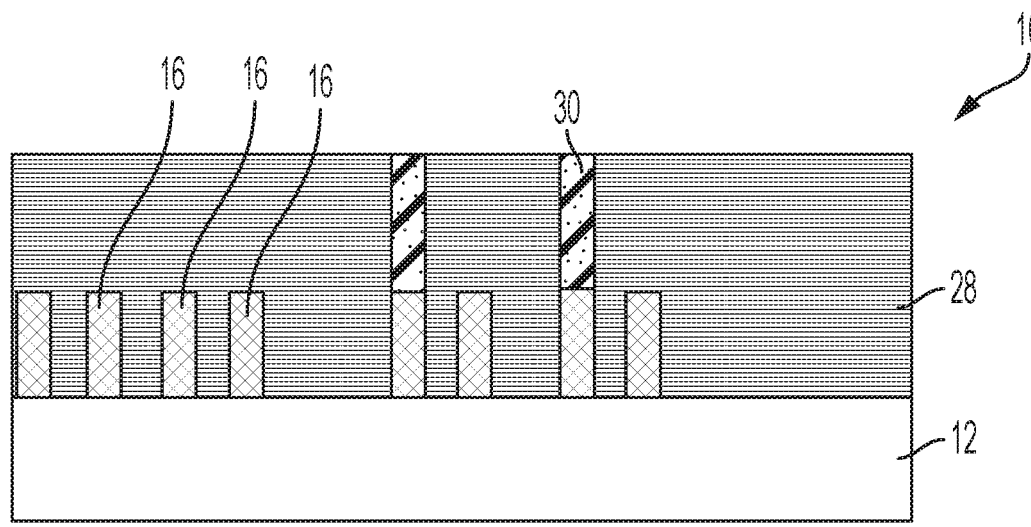
FIG. 7 depicts a top down view and a cross sectional view of the semiconductor structure of FIG. 6 subsequent to deposition of an interlayer dielectric layer and via formation therein to selected underlying metal lines in accordance with an embodiment of the present invention.

FIG. 7 depicts a cross sectional view of the semiconductor structure 10 of FIG. 6 subsequent to copper via formation to the cobalt metal lines 16 using a single damascene process. An ultra-low k dielectric, i.e., an inter-via dielectric, is deposited onto the structure, which can be the same or different as ultra-low k dielectric 28. In the illustrated structure, the ultra-low k dielectric is the same as the previously deposited ultra-low k dielectric and bears the same reference numeral 28.

A photoresist (not shown) can first be applied to the surface of the dielectric layer 28 and lithographically patterned to form contact openings corresponding to the vias. The openings are then directionally etched through the ultra-low k dielectric layer 28 so as to land on the cobalt metal line 16.

A liner layer i.e., diffusion barrier layer, (not shown) is conformally deposited onto the structure 10. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, will not further diffuse into the ultralow k dielectric 28. The liner layer can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of copper metal is then deposited to fill the vias as indicted by reference numeral 30. The copper can be deposited by CVD, sputtering, electrochemical deposition or like processes. For example, the deposition of copper can proceed by electrochemical deposition such as electroplating or electroless plating. In some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %).

Following formation of the copper metal filled vias 30, the substrate is again subjected to a planarization process to remove any metal overburden (includes the seed layer, and liner layer removal). For example, the surface can be planarized using an electropolishing process. In an electropolishing process, small amounts of metal are etched by electroetch or electrochemical etching to provide the metal filled via 30 with a top surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process.

Figure 8:
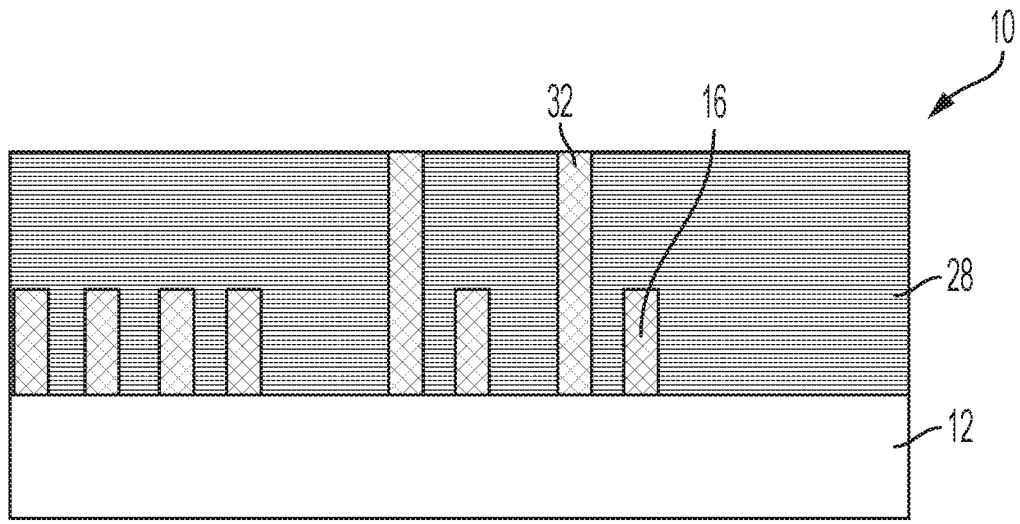
FIG. 8 depicts a top down view and a cross sectional view of the semiconductor structure of FIG. 6 subsequent to deposition of an interlayer dielectric layer and via formation therein to selected underlying metal lines in accordance with an embodiment of the present invention.

FIG. 8 depicts a cross sectional view of the semiconductor structure 10 of FIG. 6 subsequent to formation of cobalt filled vias 32 to cobalt metal lines 16 using a single damascene process as generally described above.

FIGS. 9-14 schematically illustrates multi-patterning integration of a metal spacer utilizing an inverse dual damascene process for forming a via. Referring now to FIG. 9, there is depicted a cross sectional view after spacer etch back and mandrel pull out to form a plurality of (metal spacer) lines 54 at a reduced pitch on a dielectric layer 52 of a prior metallization level defined by the metal spacer. The thickness of the metal spacer is about equal to the combined height of the via and underlying metal line, i.e., thickness=Mx+Vx.

FIG. 10 illustrates a cross sectional view and a top down view of the structure depicted in FIG. 9 subsequent to via block lithography and patterning to form via pillars. Block lithography can include depositing a trilayer including an organic planarizing layer (OPL) 56, a silicon containing hardmask 58, and a photoresist 60 onto the structure 50 and forming the pillars in the photoresist where metal vias are desired by exposing the photoresist to a pattern of activating radiation, and then developing the exposed photoresist with a resist developer to provide the patterned photoresist. At least one highly selective etch process can then be employed to transfer the via pillar pattern into the hardmask 58 and the OPL 56. After transferring the pattern, the trilayer is removed utilizing resist stripping processes, for example, ashing.

Figure 11:
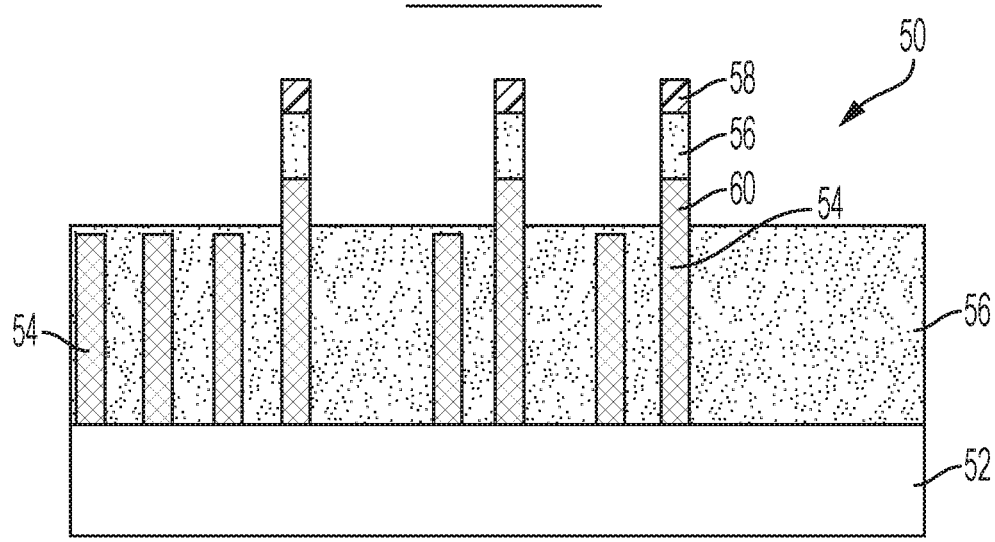
FIG. 11 depicts a top down view and a cross sectional view of the semiconductor structure of FIG. 10 subsequent to pattern transfer of the via pillar in accordance with an embodiment of the present invention.
Figure 11:
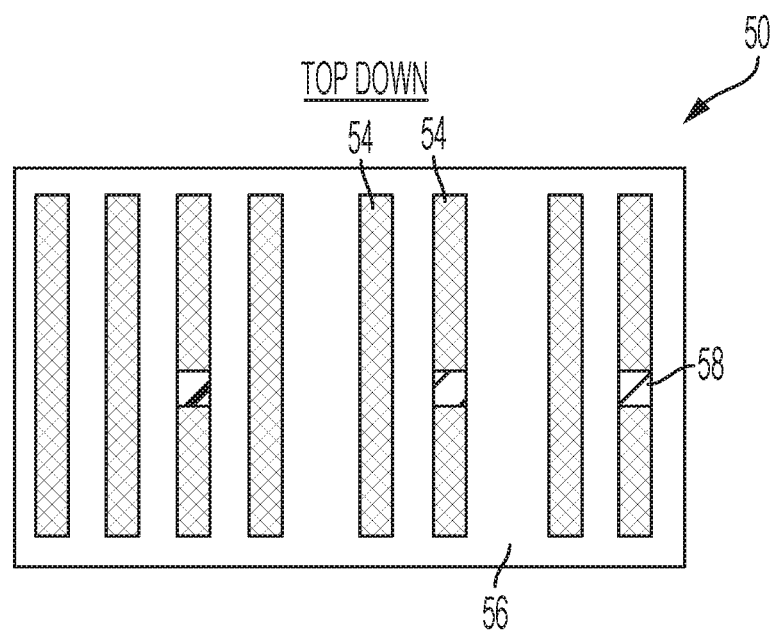

FIG. 11 illustrates a cross sectional view and a top down view of the structure depicted in FIG. 10 subsequent to etch back of the metal 54 to the OPL 56 such that the height of the metal lines is at a desired thickness for the metal lines. The hardmask 58 of the patterned via pillars protects the underlying layers including the metal line to define a tall metal via 60 that is integral to the metal line 54. As previously described in relation to FIG. 9, the initial thickness of the metal lines after spacer etch back and mandrel pull out approximates the desired combined thickness of the via (Vx) within the metallization level and the prior metal line metallization level (Mx). After transferring the pattern in this manner, the trilayer is removed utilizing resist stripping processes, for example, ashing.

Figure 12:
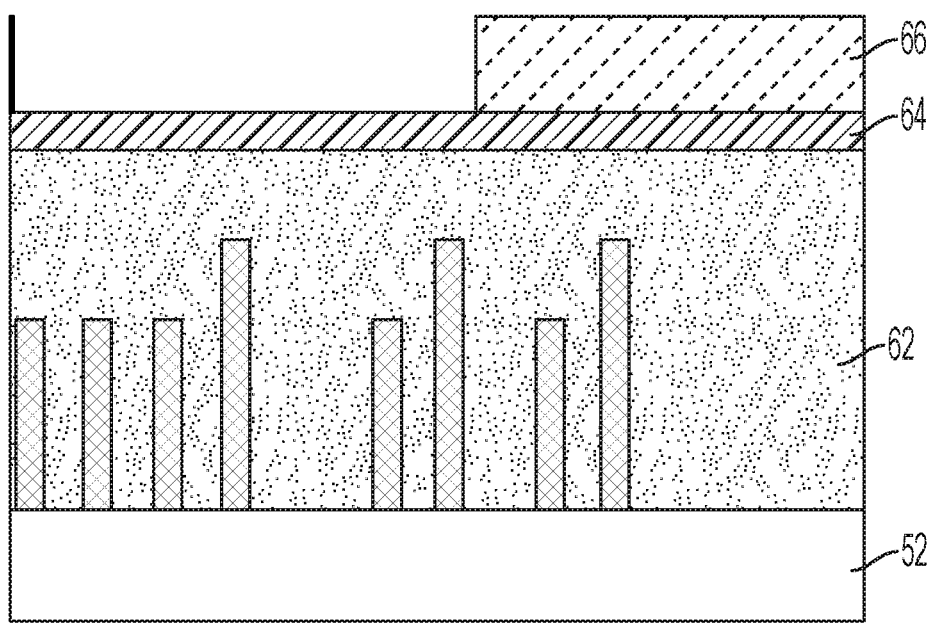
FIG. 12 depicts a top down view and a cross sectional view of the semiconductor structure of FIG. 11 subsequent to cut lithography and patterning to define a final metal line pattern in accordance with an embodiment of the present invention.
Figure 12:
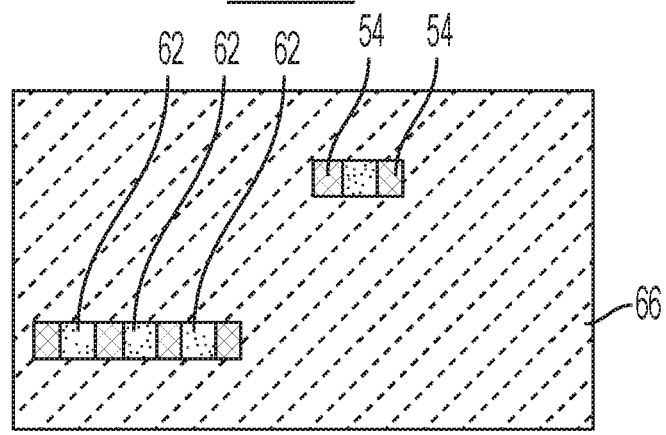

FIG. 12 illustrates a cross sectional view and a top down view of the structure 50 depicted in FIG. 11 subsequent to cut lithography and patterning to define the final metal pattern.

Figure 13:
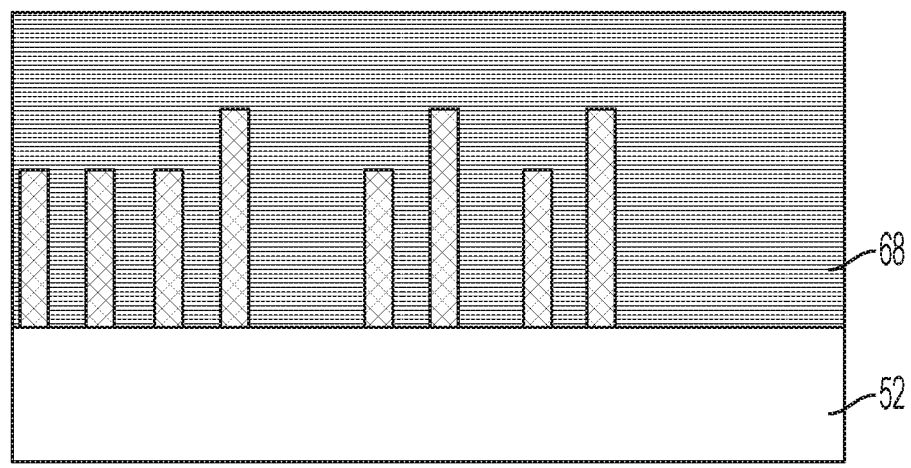
FIG. 13 depicts a top down view and a cross sectional view of the semiconductor structure of FIG. 12 subsequent to deposition of an interlayer dielectric layer therein to selected underlying metal lines in accordance with an embodiment of the present invention.
Figure 13:
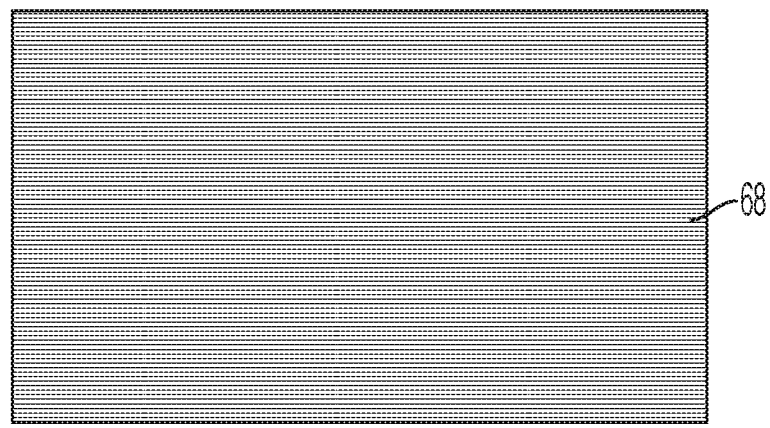

FIG. 13 illustrates a cross sectional view and a top down view of the structure depicted in FIG. 12 subsequent to removal of the trilayer utilized during final metal pattern definition and deposition of an interlayer dielectric 68.

Figure 14:
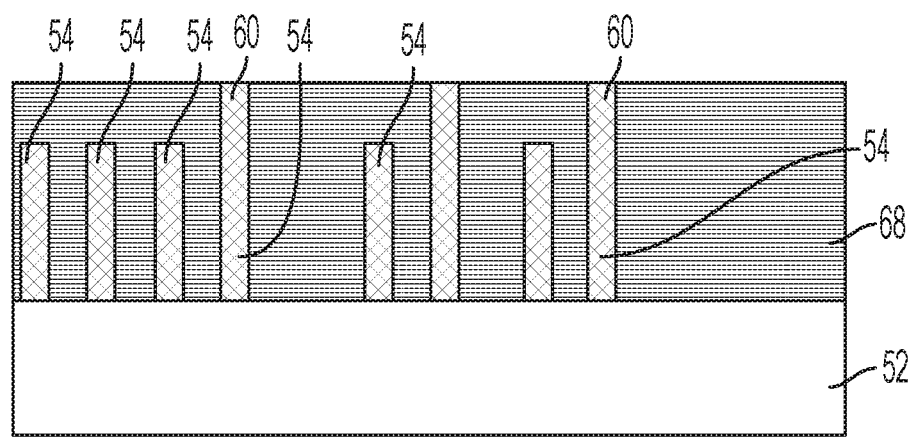
FIG. 14 depicts a top down view and a cross sectional view of the semiconductor structure of FIG. 13 subsequent to planarization of the dielectric layer to the via in accordance with an embodiment of the present invention.
Figure 14:
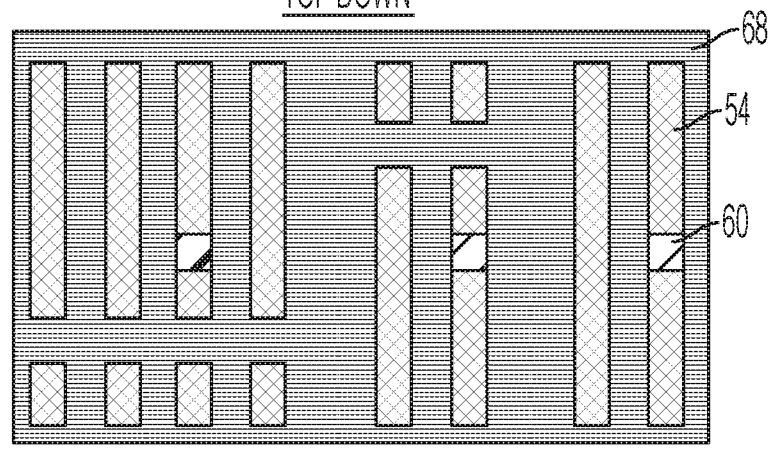

FIG. 14 illustrates a cross sectional view and a top down view of the structure depicted in FIG. 13 subsequent to planarization of the dielectric layer to the via metal.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A method of forming an interconnect structure, the method comprising:
providing a mandrel pattern overlying a dielectric layer, wherein the mandrel pattern has a height dimension equal to a combined height dimension of a metal line and a via electrically coupled to the metal line feature;
conformally depositing a metal onto the mandrel pattern;
directionally etching back the metal to form metal spacers on sidewalls of the mandrel pattern having the combined height dimension;
selectively removing the mandrel pattern;
depositing a trilayer overlaying the metal spacers, the trilayer comprising an organic planarization layer, a silicon containing hardmask layer, a photoresist layer;
patterning the photoresist layer to form one or more pillars;
etching the trilayer to expose a portion of the metal spacers followed by etch back to remove the exposed portion of the metal spacers such that metal vias are formed corresponding to locations of the one or more pillars;
forming metal lines subsequent to removal of the exposed portions, wherein the metal vias are electrically coupled to the metal lines;
lithographically defining a final metal line pattern in the metal lines;
depositing an ultra-low k dielectric layer; and
planarizing the ultra-low k dielectric layer to the metal vias.

2. The method of claim 1, wherein the metal lines and the metal vias comprise cobalt, ruthenium, tantalum, tungsten, aluminum, copper, rhodium, platinum, nickel, silver gold, or combinations thereof.

3. The method of claim 1, wherein the metal lines and the metal vias comprise cobalt.

4. The method of claim 1, wherein the mandrel pattern comprises amorphous silicon.

5. The method of claim 1, wherein the ultra-low k dielectric has a k constant of less than 3.0.

6. The method of claim 1, wherein the ultra-low k dielectric comprises porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof.

7. A self-aligned double patterning (SADP) method of forming a back end of line (BEOL) interconnect structure, the method comprising:

lithographically forming a mandrel pattern overlying a first dielectric layer, wherein the mandrel has a height dimension equal to a combined height dimension of a metal line and a via electrically coupled to the metal line;

conformally depositing a metal layer onto the mandrel pattern;

etching back the metal layer to define metal spacers on sidewalls of each mandrel in the mandrel pattern;

pulling out the mandrel pattern, wherein the metal spacers define metal lines at a pitch density greater than that of the mandrel pattern and at the combined height dimension;

depositing a first trilayer onto the metal lines and forming a final metal line pattern;

depositing a second trilayer comprising an organic planarizing layer, a silicon containing hardmask and a photoresist onto the final metal line pattern;

patterning the photoresist layer to form a plurality of pillars in alignment with selected metal lines;

etching the trilayer so as to expose a portion of the metal lines that do not underlie the plurality of pillars;

etching back the exposed portion of the metal lines to define a height dimension of the metal lines, wherein the metal line underlying the plurality of pillars further comprises a via, wherein the combination of the metal lines and the via are at the combined height;

removing a remaining portion of the second trilayer;

defining a final metal pattern from the metal lines;

depositing an interlayer dielectric layer; and planarizing the interlayer dielectric layer to the via so as to form a planar top surface.

* * * * *